(12) United States Patent
Becker et al.

(10) Patent No.: US 12,437,989 B2
(45) Date of Patent: Oct. 7, 2025

(54) METHOD FOR DEPOSITING A SILICON GERMANIUM LAYER ON A SUBSTRATE

(71) Applicant: Siltronic AG, Munich (DE)

(72) Inventors: Lucas Becker, Simbach (DE); Peter Storck, Burghausen (DE)

(73) Assignee: SILTRONIC AG, Munich (DE)

( * ) Notice: Subject to any disclaimer, the term of this patent is extended or adjusted under 35 U.S.C. 154(b) by 423 days.

(21) Appl. No.: 18/022,177

(22) PCT Filed: Aug. 18, 2021

(86) PCT No.: PCT/EP2021/072926
§ 371 (c)(1),
(2) Date: Feb. 20, 2023

(87) PCT Pub. No.: WO2022/048908
PCT Pub. Date: Mar. 10, 2022

(65) Prior Publication Data
US 2023/0326750 A1    Oct. 12, 2023

(30) Foreign Application Priority Data

Sep. 4, 2020    (EP) ..................................... 20194591

(51) Int. Cl.
*H01L 21/20*    (2006.01)
*C23C 16/02*    (2006.01)
(Continued)

(52) U.S. Cl.
CPC ...... *H01L 21/02532* (2013.01); *C23C 16/029* (2013.01); *C23C 16/042* (2013.01);
(Continued)

(58) Field of Classification Search
CPC ..... H01L 21/308–3083; H01L 21/0273–0279; H01L 21/312–3128;
(Continued)

(56) References Cited

U.S. PATENT DOCUMENTS 8,778,778 B2 *   7/2014   Tanida ................. H10F 39/011
                                                    438/57
9,064,770 B2 *   6/2015   Kuo .................... H01L 21/0209
(Continued)

FOREIGN PATENT DOCUMENTS

CN    1503327 A    6/2004
DE    102006030266 A1    1/2008

*Primary Examiner* — Ismail A Muse
(74) *Attorney, Agent, or Firm* — LEYDIG, VOIT & MAYER, LTD.

(57) ABSTRACT

A method heteroepitaxially deposits a silicon germanium layer on a substrate. The silicon germanium layer has a composition $Si_{1-x}Ge_x$, where $0.01 \leq x \leq 1$. The substrate is a silicon single crystal wafer or a silicon-on-insulator wafer. The method includes: providing a mask layer atop the substrate; removing the mask layer in an edge region of the substrate to provide access to an annular-shaped free surface of the substrate in the edge region of the substrate surrounding a remainder of the mask layer; depositing an edge reservoir consisting of a relaxed or partially relaxed silicon germanium layer atop the annular-shaped free surface of the substrate; removing the remainder of the mask layer; and depositing the silicon germanium layer atop the substrate and atop the edge reservoir, the silicon germanium layer contacting an inner lateral surface of the edge reservoir.

7 Claims, 6 Drawing Sheets

(51) Int. Cl.
  *C23C 16/04* (2006.01)
  *C23C 16/06* (2006.01)
  *C30B 25/04* (2006.01)
  *C30B 25/18* (2006.01)
  *C30B 29/52* (2006.01)
  *H01L 21/02* (2006.01)
  *H01L 21/36* (2006.01)

(52) U.S. Cl.
  CPC .............. *C23C 16/06* (2013.01); *C30B 25/04* (2013.01); *C30B 25/18* (2013.01); *C30B 29/52* (2013.01); *H01L 21/02381* (2013.01); *H01L 21/02639* (2013.01)

(58) Field of Classification Search
  CPC ......... H01L 21/027–0338; H01L 21/32; H01L 21/0271–0279; H01L 21/033–0338; H01L 21/314–3185; H01L 21/02532; H01L 21/02381; H01L 21/02639; H01L 21/0243; C30B 25/04; C30B 25/18
  See application file for complete search history.

(56) References Cited

U.S. PATENT DOCUMENTS

| | | | |
|---|---|---|---|
| 9,893,116 B2* | 2/2018 | Takyu | H10F 39/809 |
| 2004/0075105 A1 | 4/2004 | Leitz et al. | |
| 2004/0094763 A1 | 5/2004 | Agnello et al. | |
| 2008/0003830 A1 | 1/2008 | Qing et al. | |
| 2010/0291761 A1 | 11/2010 | Storck et al. | |
| 2010/0317177 A1 | 12/2010 | Huang et al. | |
| 2012/0211849 A1* | 8/2012 | Matsugai | H10F 39/12 438/455 |
| 2014/0273480 A1 | 9/2014 | Previtali et al. | |
| 2015/0001682 A1 | 1/2015 | Liu et al. | |
| 2017/0263440 A1 | 9/2017 | Schulze et al. | |
| 2020/0279730 A1* | 9/2020 | Nishikage | H01L 21/02433 |
| 2021/0305205 A1* | 9/2021 | Hsieh | H01L 21/78 |
| 2024/0249921 A1* | 7/2024 | Park | H01J 37/32743 |

* cited by examiner

METHOD FOR DEPOSITING A SILICON GERMANIUM LAYER ON A SUBSTRATE

CROSS REFERENCE TO RELATED APPLICATIONS

This application is a U.S. National Phase application under 35 U.S.C. § 371 of International Application No. PCT/EP2021/072926, filed on Aug. 18, 2021, and claims benefit to European Patent Application No. EP 20194591.2, filed on Sep. 4, 2020. The International Application was published in English on Mar. 10, 2022 as WO 2022/048908 A1 under PCT Article 21(2).

FIELD

The present disclosure relates to a method for depositing a silicon germanium (SiGe) layer on a substrate.

BACKGROUND

Semiconductor devices using SiGe channels represent an interesting alternative to respective devices based on silicon, only. In order to provide a SiGe layer for the integration of SiGe channels, a SiGe layer is usually heteroepitaxially deposited atop a substrate, e.g. a silicon single crystal wafer. Misfit dislocations (MD), threading dislocations (TD), and dislocation pile-ups (DP) of threading dislocations can be formed in the course of the deposition process due to a lattice-mismatch of the substrate and the heteroepitaxial SiGe layer.

Many attempts have been made to reduce problems connected with the presence of MD, TD and DP as well as with a cross-hatch roughening the surface of the heteroepitaxial SiGe layer.

US 2010 0 291 761 A1 proposes the provision of a stress compensating SiGe layer deposited on the back side of the substrate.

US 2010 0 317 177 A1 discloses a method which comprises depositing a first SiGe layer on the substrate and a second SiGe layer atop the first SiGe layer.

According to US 2004 0 075 105 A1 the formation of DP can be reduced through a method comprising forming a substantially relaxed cap layer on a first semiconductor layer, which has a plurality of TD distributed substantially uniform across its surface.

Recently, a thesis (Fabrizio Rovaris, Continuum modeling of heteroepitaxy at the mesoscale: tackling elastic and plastic relaxation, University of Milano-Bicocca DEPARTMENT OF MATERIALS SCIENCE, Academic year 2019/2020) was published reporting that the presence of a high-defective region at the edge of the substrate provides a reservoir of threading arms ready to relax as soon as the growing film reach the critical thickness and that, as effect, a significant reduction of the density of TD is observed by eliminating the random nucleation of loops for the first stages of the relaxation.

SUMMARY

In an embodiment, the present disclosure provides a method that heteroepitaxially deposits a silicon germanium layer on a substrate. The silicon germanium layer has a composition Si1-xGex, where $0.01 \leq x \leq 1$. The substrate is a silicon single crystal wafer or a silicon-on-insulator wafer. The method includes: providing a mask layer atop the substrate; removing the mask layer in an edge region of the substrate to provide access to an annular-shaped free surface of the substrate in the edge region of the substrate surrounding a remainder of the mask layer; depositing an edge reservoir consisting of a relaxed or partially relaxed silicon germanium layer atop the annular-shaped free surface of the substrate; removing the remainder of the mask layer; and depositing the silicon germanium layer atop the substrate and atop the edge reservoir, the silicon germanium layer contacting an inner lateral surface of the edge reservoir.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
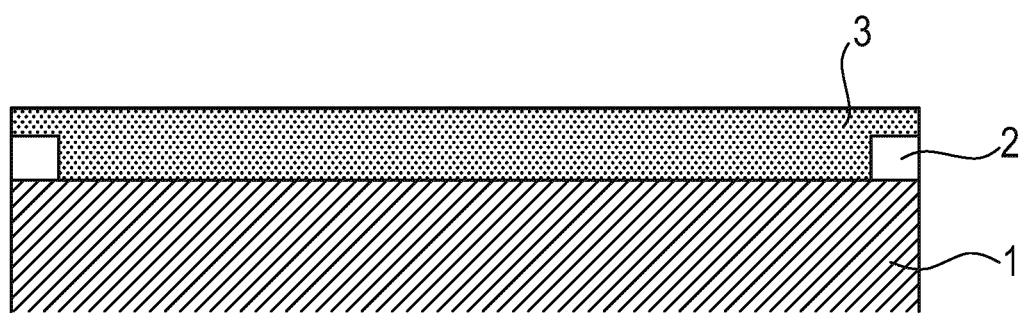
FIG. 1 represents a sectional view of an embodiment of the wafer in its final state of production.

Aspects of the present disclosure provide for reducing the TD density of a SiGe layer heteroepitaxially deposited on a substrate.

According to one aspect, the present disclosure provides a method for heteroepitaxially depositing a silicon germanium layer on a substrate, comprising:
  providing a mask layer atop the substrate;
  removing an outer section of the mask layer to provide access to an annular-shaped free surface of the substrate in an edge region of the substrate surrounding a remainder of the mask layer;
  depositing a cylindrical silicon germanium layer atop the annular-shaped free surface of the substrate;
  removing the remainder of the mask layer; and
  depositing the silicon germanium layer atop the substrate and atop the cylindrical silicon germanium layer, the silicon germanium layer contacting an inner lateral surface of the cylindrical silicon germanium layer.

SiGe buffer layers on silicon single crystal substrates relax by heterogeneous nucleation at preferential nucleation sites, as no pre-existing dislocations exist in the substrate.

The edge of Si wafers exhibit mechanical defects, which serve as preferential nucleation sites. Strain energy is building up in the epitaxial layer during growth and once the activation energy for this process is reached, dislocations rapidly nucleate at these sites, forming thick dislocation bundles. These bundles of misfit dislocations lead to the formation of threading dislocation pileups, as they are effective in blocking the glide of other dislocations. As dislocations are blocked, more dislocations need to be nucleated to relax the layer completely, which leads to a higher threading dislocation density (TDD). For a more controlled relaxation process and prevention of misfit dislocation bundles, an evenly distributed source of dislocations is needed, that has a low activation energy.

The present disclosure provides a way to implement such source in an edge region of the SiGe layer. This edge reservoir consists of a relaxed or partially relaxed SiGe layer (hereinafter referred to as cylindrical SiGe layer) that is deposited before the SiGe layer. The SiGe layer has a vertical contact to or both, a vertical and a horizontal contact to the cylindrical SiGe layer. Preexisting dislocations contained in this edge reservoir are used to relax the SiGe layer in the initial phase of relaxation by gliding freely towards the center of the wafer upon reaching the critical thickness, leaving behind extremely long misfit dislocation segments without being blocked. This process prevents the formation of thick dislocation bundles by heterogeneous nucleation at the wafer edge, thus preventing the formation of DP and lowering the overall TDD.

Although the following description is dealing with the deposition of a SiGe layer on a silicon single crystal substrate, other substrates like silicon-on-insulator (SOI) wafers may be used, as well. According to a preferred embodiment of the present disclosure, the substrate is a silicon single crystal wafer having a diameter of 200 mm or 300 mm.

For the provision of the cylindrical SiGe layer at the edge of the substrate, a masking approach is pursued. In principle, any masking mechanism for temporarily excluding a surface area of the substrate from deposition with an SiGe layer may be used. According to a preferred embodiment of the present disclosure, an oxidic material like $SiO_2$ is used as masking material, e.g. a low temperature oxide (LTO). An LTO may be deposited atop of the substrate by chemical vapor deposition (CVD) at temperatures between 300° C. and 500° C. in an atmosphere containing silane ($SiH_4$) and oxygen ($O_2$). Alternatively, other known methods for depositing an oxidic layer may be used or the oxidic layer may be grown through dry oxidation in a rapid thermal anneal (RTP) furnace at temperatures between 850° C. and 1200° C.

Next, the mask layer is removed in an edge region of the substrate for providing an annular-shaped free surface of the substrate that extends from the edge of the substrate towards the center of the substrate. The mask layer in the edge region may be removed e.g. by wet etching with hydrofluoric acid or with ammonium fluoride and hydrofluoric acid or by plasma etching with e.g. $CF_4$ or the like. According to an embodiment of the present disclosure, the mask layer in the edge region of the substrate may be removed by putting the substrate face down on a support and by introducing HF fumes in a process chamber, the HF fumes diffusing between the support and the mask etch away a mask portion having a width of up to 1.5 mm.

According to an embodiment of the present disclosure, the annular-shaped free surface of the substrate radially extends form the edge towards the center of the substrate over a distance which is preferably not less than 200 μm and not more than 1.5 mm. The width of the annular-shaped free surface of the substrate may even be as small as the length of an edge portion of the substrate, where the thickness of the substrate decreases, or may be even smaller.

Next, the cylindrical SiGe layer is epitaxially deposited on the annular-shaped free surface of the substrate. According to an embodiment of the present disclosure, CVD under atmospheric pressure is performed for the deposition of the cylindrical SiGe layer. Details of the deposition process are discussed in US 2010 0 317 177 A1. Alternatively, the deposition may be performed under reduced pressure and at lower temperatures. According to an embodiment of the present disclosure, the composition of the cylindrical SiGe layer is $Si_{1-x}Ge_x$, wherein $0.01 \leq x \leq 1$. According to a further preferred embodiment of the present disclosure, the cylindrical SiGe layer has a thickness of not less than 10 nm and not more than 10 μm, and the cylindrical SiGe layer is partially or fully relaxed. The mentioned properties of the cylindrical SiGe layer allow to properly control the TDD of the cylindrical SiGe layer, which aids in the reduction of the TD density of a SiGe layer heteroepitaxially deposited on a substrate. The TDD of the cylindrical SiGe layer is preferably at least $1.0 \times 10^3$ cm$^{-2}$.

After the provision of the cylindrical SiGe layer in the edge region of the substrate, the remaining mask layer, which is surrounded by the cylindrical SiGe layer is removed and the surface of the substrate that was covered with the mask layer becomes accessible for the deposition of an SiGe layer contacting the surface of the substrate and an inner and upper surface of the cylindrical SiGe layer. According to a preferred embodiment of the present disclosure, the SiGe layer is epitaxially deposited via CVD under atmospheric pressure. According to a further preferred embodiment of the present disclosure, the composition of the SiGe layer is $Si_{1-x}Ge_x$, wherein $0.01 \leq x \leq 1$. According to an embodiment of the present disclosure, the SiGe layer is a graded buffer layer or a constant composition layer. The SiGe layer is partially or fully relaxed and contacts the substrate and an inner surface of the cylindrical SiGe layer or the substrate and both, an inner and an upper surface of the cylindrical SiGe layer. The content of germanium of the cylindrical SiGe layer may be lower, equal to or higher than the germanium content of the SiGe layer. The SiGe layer has a thickness, which is preferably not less than 0.01 μm and not more than 10 μm.

The threading dislocations contained in the cylindrical SiGe layer cause the SiGe layer to relax by gliding towards the center upon reaching the critical thickness. The result is a reduction of the pile-up density and the threading dislocation density, as well as an improvement of surface roughness and the overall uniformity compared to prior art approaches.

Figure 2:
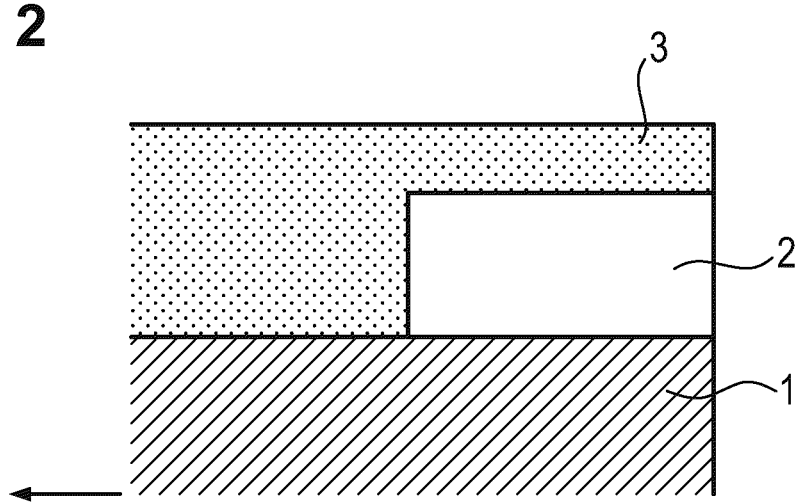
FIG. 2 represents a sectional view displaying an edge region of the wafer shown in FIG. 1.

In the final state of production, a wafer produced in accordance with an aspect of the present disclosure may have the structure displayed in FIG. 1. This structure comprises a substrate 1, a cylindrical silicon germanium layer 2 and a silicon germanium layer 3 contacting an inner and an upper surface of the cylindrical silicon germanium layer 2. In FIG. 2 an edge region of this wafer is shown that extends in the direction of the arrow from the edge of the wafer towards the center of the wafer.

Figure 3:
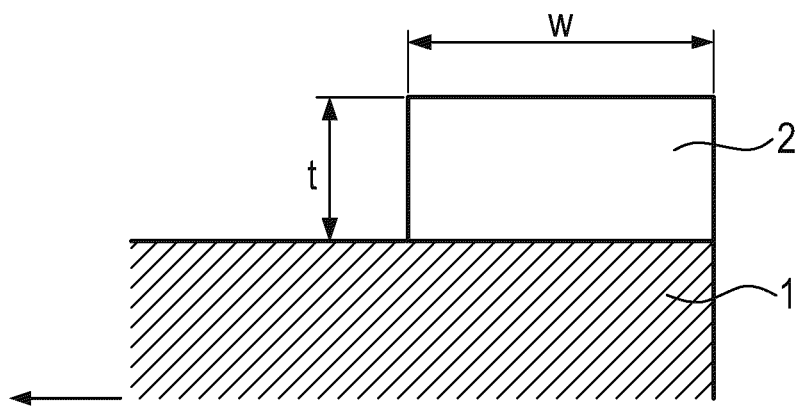
FIG. 3 differs from FIG. 2, only, that the edge region of the wafer is shown in an intermediate state of production of the wafer.
Figure 4:
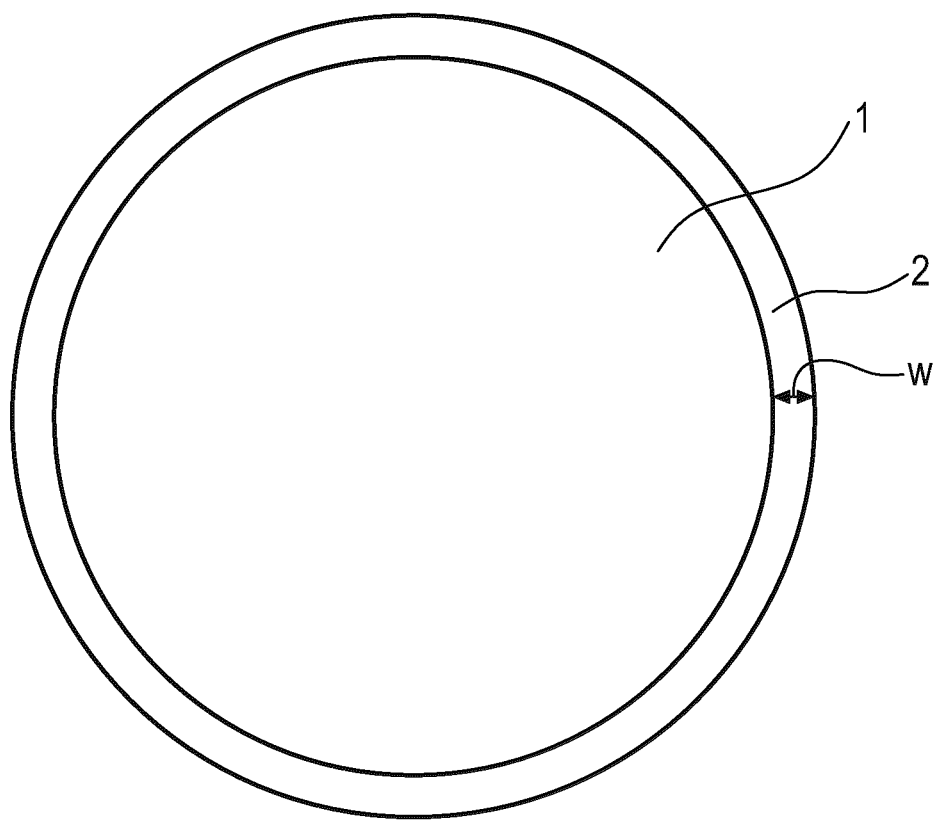
FIG. 4 is top-view representation of the wafer according to FIG. 3.

Before the deposition of the silicon germanium layer 3, the wafer is in an intermediate state displayed in FIG. 3. The structure of the intermediate state comprises the substrate 1 and the cylindrical silicon germanium layer 2 which has a radial width w and a thickness t. FIG. 4 represents a top-view of the wafer in the intermediate state.

Figure 5:
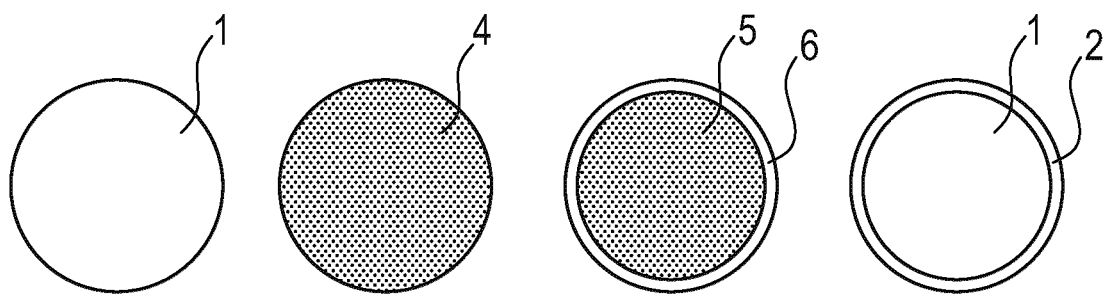
FIG. 5 displays in top-view representation of states of the wafer in the course of the claimed process starting with the substrate and ending with the intermediate state of production of the wafer according to FIGS. 3 and 4.

In order to achieve the intermediate state, a mask layer 4 is provided atop an upper surface of the substrate 1 as shown in FIG. 5. Then, an outer section of the mask layer 4 is removed to provide access to an annular-shaped free surface 6 of the substrate 1 in an edge region of the substrate 1. Next, the cylindrical silicon germanium layer 2 is deposited on the annular-shaped free surface 6 and surrounds a remainder 5 of the mask layer 4. Subsequently, the remainder 6 of the mask layer 4 is removed, as well, to provide the intermediate state for the subsequent deposition of the silicon germanium layer 3 on the substrate 1 and the cylindrical silicon germanium layer 2.

Figure 6:
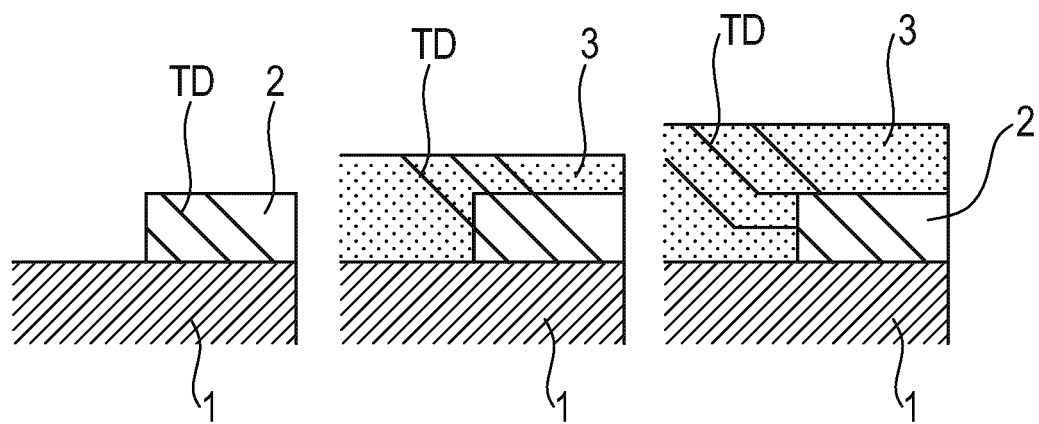
FIG. 6 shows the evolution of TD starting with the intermediate state of production of the wafer according to FIG. 3 and ending with the final state of production according to FIG. 2.

FIG. 6 shows the evolution of TD starting with the intermediate state of production until the final state of production. The threading dislocations contained in the cylindrical silicon germanium layer 2 promote the relaxation of the silicon germanium layer 3 by gliding towards the center once the critical thickness is reached.

Figure 7:
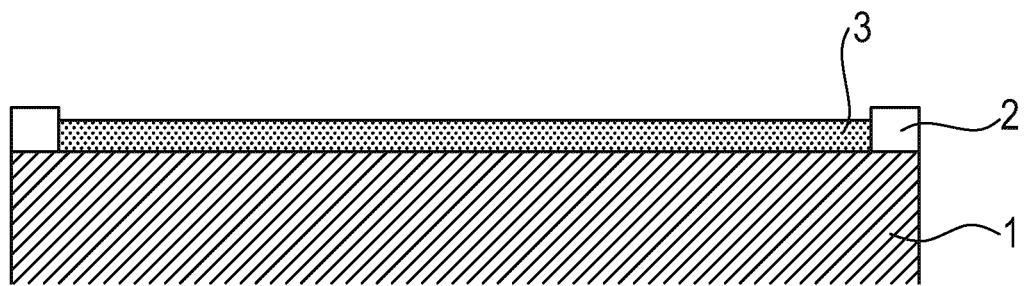
FIG. 7 represents a sectional view of another embodiment of the wafer in its final state of production.
Figure 8:
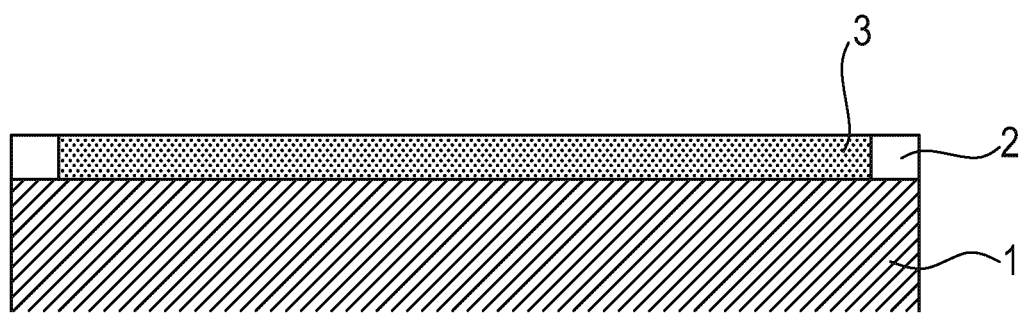
FIG. 8 represents a sectional view of still another embodiment of the wafer in its final state of production.

In the final state of production, a wafer produced in accordance with an aspect of the present disclosure may also have the structure displayed in FIG. 7 or FIG. 8. According to the embodiment displayed in FIG. 7, the silicon germanium layer 3 contacts the surface of the substrate 1 and the inner surface of the cylindrical silicon germanium layer 2 up to a certain height thereof. According to the embodiment displayed in FIG. 8, the silicon germanium layer 3 and the cylindrical silicon germanium layer 2 have the same thickness.

Figure 9:
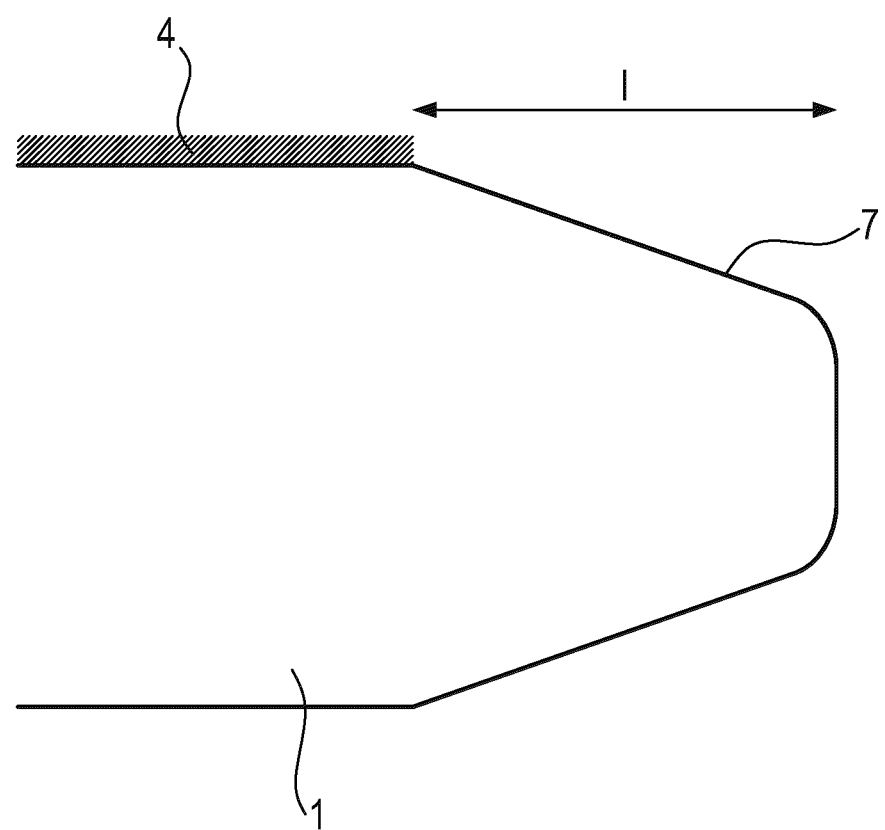
FIG. 9 represents a sectional view of the edge region of the substrate.

As shown in FIG. 9, the width of the annular-shaped free surface of the substrate may even be as small as the length l of an edge portion 7 of the substrate 1, where the thickness of the substrate decreases, or may be even smaller than the length l.

The description hereinabove of illustrative embodiments is to be understood as being exemplary.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 1 substrate
2 cylindrical silicon germanium layer
3 silicon germanium layer
4 mask layer
5 remainder of the mask layer
6 annular-shaped free surface of the substrate
7 edge portion
l length of edge portion
w width
t thickness
TD threading dislocation

The invention claimed is:

1. A method for heteroepitaxially depositing a silicon germanium layer on a substrate, the silicon germanium layer having a composition $Si_{1-x}Ge_x$, wherein $0.01 \leq x \leq 1$, and the substrate being a silicon single crystal wafer or a silicon-on-insulator wafer, the method comprising:
providing a mask layer atop the substrate;
removing the mask layer in an edge region of the substrate to provide access to an annular-shaped free surface of the substrate in the edge region of the substrate surrounding a remainder of the mask layer;
depositing an edge reservoir consisting of a relaxed or partially relaxed silicon germanium layer atop the annular-shaped free surface of the substrate;
removing the remainder of the mask layer; and
depositing the silicon germanium layer atop the substrate and atop the edge reservoir, the silicon germanium layer contacting an inner lateral surface of the edge reservoir.

2. The method as claimed in claim 1, the method further comprising:
providing a low temperature oxide material as the mask layer.

3. The method as claimed in claim 1, the method further comprising:
depositing the cylindrical silicon germanium layer atop the annular-shaped free surface of the substrate such that is has a width of not more than 1.5 mm and a thickness of not less than 10 nm and not more than 10 µm.

4. The method as claimed in claim 1, the method further comprising:
depositing the silicon germanium layer atop the substrate and atop the cylindrical silicon germanium layer such that is has a thickness of not less than 0.01 µm and not more than 10 µm.

5. The method as claimed in claim 1, wherein the silicon germanium layer is a constant composition layer.

6. The method as claimed in claim 1, wherein the silicon germanium layer is a graded composition layer.

7. The method as claimed in claim 1, wherein the content of germanium of the cylindrical SiGe layer is lower, equal to, or higher than the germanium content of the SiGe layer.

* * * * *